(12) United States Patent
Satake

(10) Patent No.: US 12,300,530 B2
(45) Date of Patent: May 13, 2025

(54) PLACEMENT STAGE AND SUBSTRATE PROCESSING APPARATUS

(71) Applicant: TOKYO ELECTRON LIMITED, Tokyo (JP)

(72) Inventor: Daisuke Satake, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 282 days.

(21) Appl. No.: 16/943,600

(22) Filed: Jul. 30, 2020

(65) Prior Publication Data

US 2021/0043489 A1 Feb. 11, 2021

(30) Foreign Application Priority Data

Aug. 9, 2019 (JP) .................................. 2019-148131

(51) Int. Cl.
*H01L 21/683* (2006.01)
*H01J 37/32* (2006.01)
(52) U.S. Cl.
CPC .... *H01L 21/6833* (2013.01); *H01J 37/32715* (2013.01); *H01J 2237/2007* (2013.01)
(58) Field of Classification Search
None
See application file for complete search history.

(56) References Cited

U.S. PATENT DOCUMENTS

| 5,520,142 | A | * | 5/1996 | Ikeda | ........................ B01J 3/03 |
| | | | | | 156/345.31 |
| 5,848,670 | A | * | 12/1998 | Salzman | ................... B66F 7/00 |
| | | | | | 414/935 |
| 6,416,634 | B1 | * | 7/2002 | Mostovoy | .............. F16J 15/062 |
| | | | | | 204/192.12 |
| 7,638,003 | B2 | * | 12/2009 | Satoh | .................. C23C 16/4586 |
| | | | | | 118/728 |

(Continued)

FOREIGN PATENT DOCUMENTS

| JP | 2016-28448 A | 2/2016 |
| WO | 2013118781 A1 | 8/2013 |
| WO | 2018216797 A1 | 11/2018 |

OTHER PUBLICATIONS

Convex and concave polygons. Source: https://www.math-only-math.com/convex-and-concave-polygons.html Printed on Apr. 17, 2023. (Year: 2023).*

*Primary Examiner* — Parviz Hassanzadeh
*Assistant Examiner* — Tiffany Z Nuckols
(74) *Attorney, Agent, or Firm* — Nath, Goldberg & Meyer; Jerald L. Meyer; Tanya E. Harkins

(57) ABSTRACT

A placement stage includes: a wafer placement part having a placement surface and a first through hole; a base bonded to a rear surface of the wafer placement part by a first adhesive layer, and including a second through hole formed in the base, the second through hole communicating with the first through hole; a sleeve installed in the second through hole to be detachable from the base; and the sealing member (Continued)

installed between the rear surface and the sleeve to be spaced apart from the first adhesive layer so as to seal the first adhesive layer. A convex portion is formed to extend on an outer circumference or an inner circumference of a tip end of the sleeve, and the sealing member is pressed against a tip end surface of the sleeve to expand and contract.

13 Claims, 5 Drawing Sheets

(56) References Cited

U.S. PATENT DOCUMENTS

| | | | |
|---|---|---|---|
| 2004/0065259 A1* | 4/2004 | Inazumachi | H01L 21/67109 118/724 |
| 2005/0042881 A1* | 2/2005 | Nishimoto | H01L 21/6833 361/234 |
| 2011/0164955 A1* | 7/2011 | White | H01L 21/68742 414/800 |
| 2013/0286530 A1* | 10/2013 | Lin | B32B 3/08 428/68 |
| 2014/0202635 A1* | 7/2014 | Yamaguchi | H01L 21/6831 279/128 |
| 2014/0346152 A1* | 11/2014 | Sasaki | H01L 21/6831 219/121.58 |
| 2014/0376148 A1 | 12/2014 | Sasaki et al. | |
| 2017/0221750 A1* | 8/2017 | Cotlear | H01L 21/6831 |
| 2019/0019714 A1* | 1/2019 | Kosakai | H01L 21/6833 |
| 2019/0131163 A1* | 5/2019 | Kuno | H01L 21/67109 |

\* cited by examiner

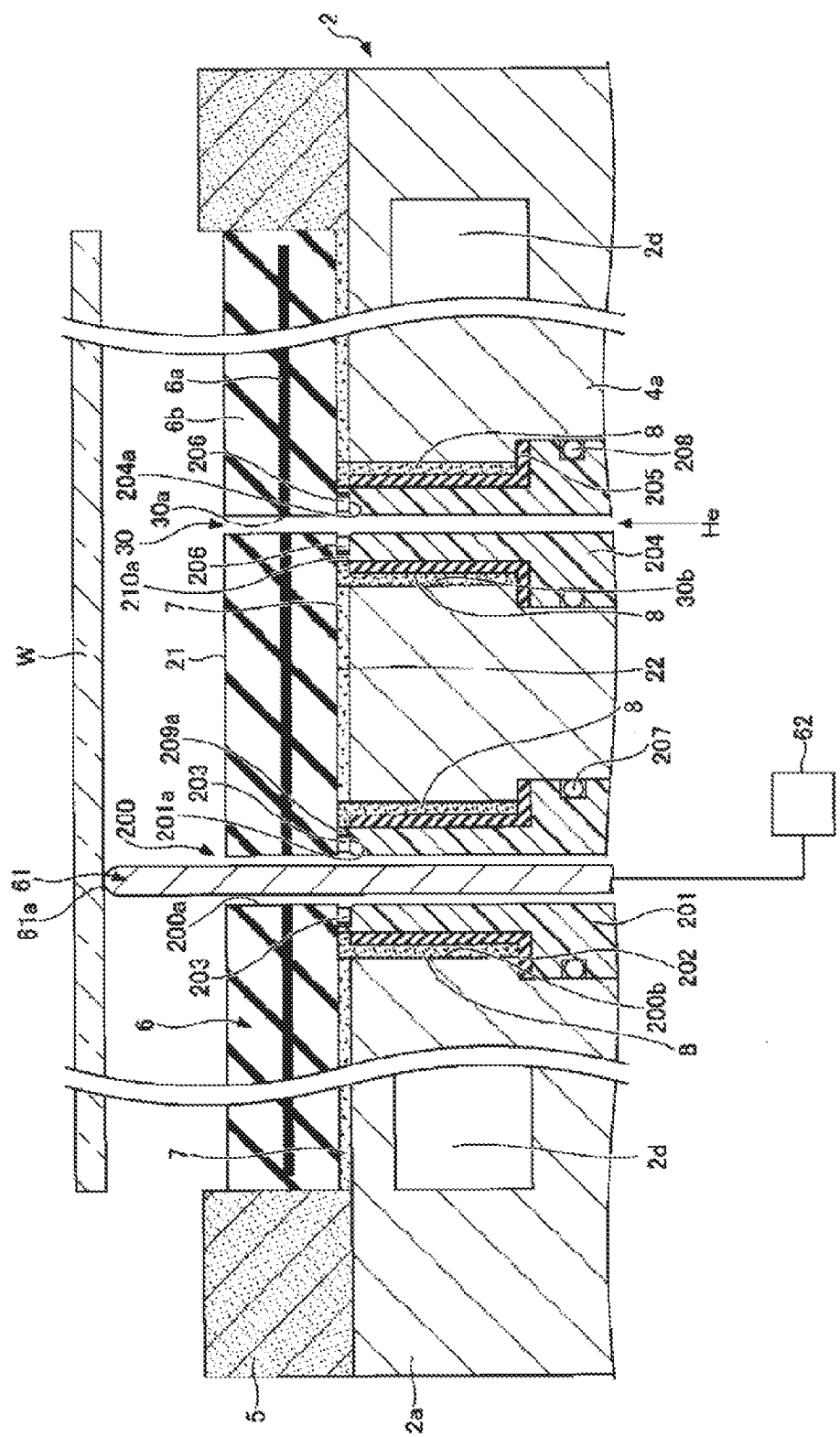

PLACEMENT STAGE AND SUBSTRATE PROCESSING APPARATUS

CROSS-REFERENCE TO RELATED APPLICATION

This application is based upon and claims the benefit of priority from Japanese Patent Application No. 2019-148131, filed on Aug. 9, 2019, the entire contents of which are incorporated herein by reference.

TECHNICAL FIELD

The present disclosure relates to a placement stage and a substrate processing apparatus.

BACKGROUND

There is known a plasma processing apparatus that includes a vacuum processing chamber, a placement stage that holds a target object and that also functions as a lower electrode in the processing chamber, and an upper electrode that faces the placement stage (see, for example, Patent Document 1).

The placement stage of such a plasma processing apparatus includes an electrostatic chuck, a base, and a cylindrical sleeve. A first through hole is formed in the electrostatic chuck. The base is bonded to the rear surface of the electrostatic chuck by a first adhesive layer, and a second through hole communicating with the first through hole is formed in the base. The sleeve is bonded to the rear surface of the electrostatic chuck by a second adhesive layer in the state in which the sleeve communicates with the first through hole. As a result, the cylindrical sleeve is bonded to the rear surface of the electrostatic chuck in the state in which the second through hole formed in the base communicates with the first through hole. Since plasma or radicals introduced from the first through hole or the second through hole are blocked by the sleeve, the first adhesive layer, that is, the adhesive used for bonding and coupling of the electrostatic chuck, can be prevented from being consumed due to direct exposure to the plasma or radicals.

PRIOR ART DOCUMENT

Patent Document

Patent Document 1: Japanese Laid-Open Patent Publication No. 2016-28448

SUMMARY

According to one embodiment of the present disclosure, there is provided a placement stage including: a wafer placement part having a placement surface on which a wafer is placed and a first through hole formed therein; a base bonded to a rear surface of the wafer placement part by a first adhesive layer, and including a second through hole formed in the base, the second through hole having a hole diameter larger than a hole diameter of the first through hole and communicating with the first through hole; a cylindrical sleeve installed in the second through hole to be detachable from the base together with a sealing member; and the sealing member installed between the rear surface of the wafer placement part and the sleeve to be spaced apart from the first adhesive layer so as to seal the first adhesive layer, wherein a convex portion is formed to extend on at least one of an outer circumference and an inner circumference of a tip end of the sleeve in a circumferential direction, and the sealing member is pressed against a tip end surface of the sleeve to expand and contract.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a view illustrating an exemplary placement stage according to an embodiment.

DETAILED DESCRIPTION

Figure 1:
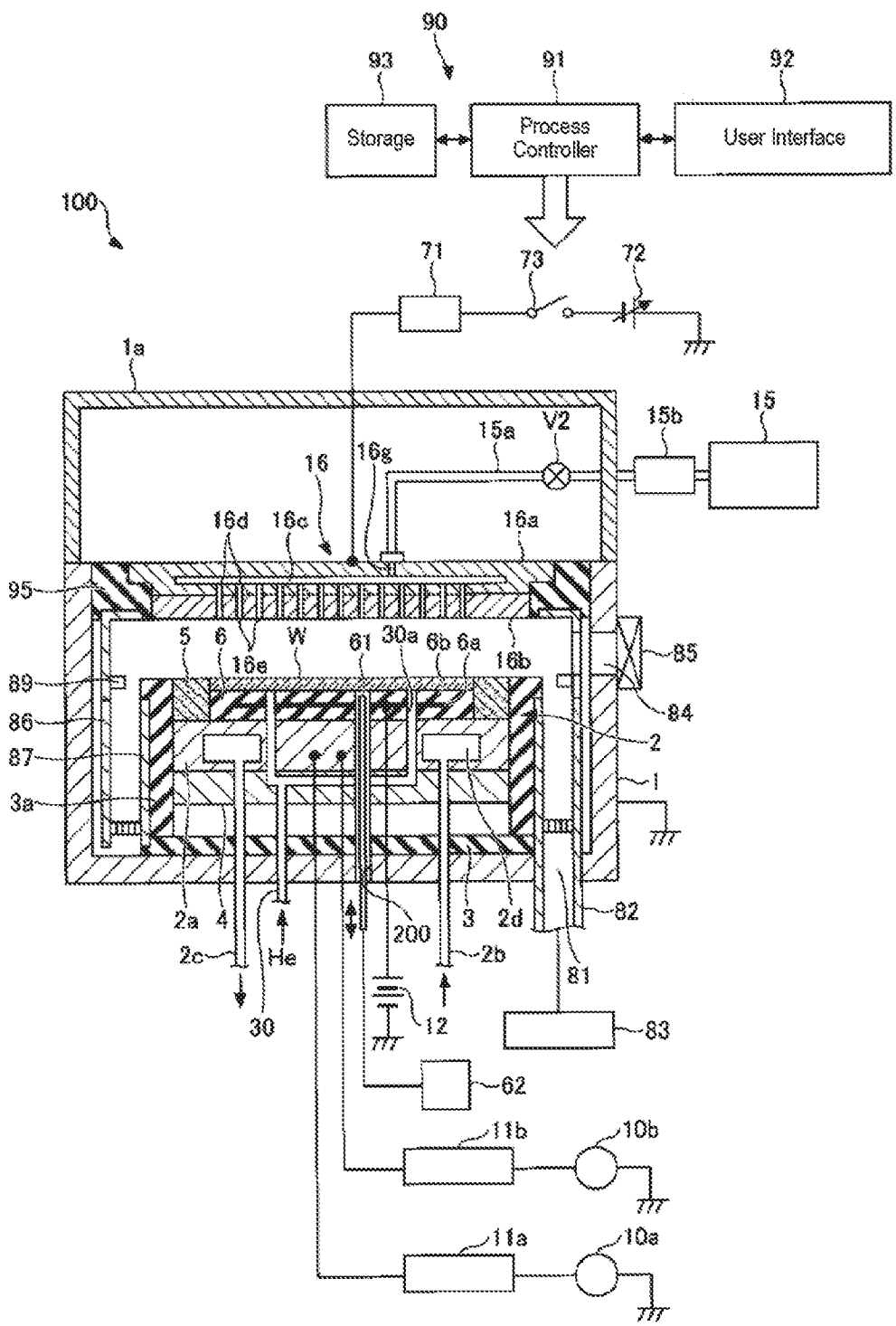
FIG. 1 is a schematic cross-sectional view illustrating an exemplary substrate processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In each of the drawings, the same components are denoted by the same reference numerals, and redundant descriptions may be omitted.

Substrate Processing Apparatus

FIG. 1 is a schematic cross-sectional view illustrating the configuration of a substrate processing apparatus 100 according to the present embodiment. The substrate processing apparatus 100 includes a processing chamber 1 that is configured to be airtight and is electrically set to ground potential. The processing chamber 1 has a cylindrical shape and is made of, for example, aluminum. A placement stage 2 on which a wafer W is placed is installed in the processing chamber 1. The placement stage 2 has a base 2a and an electrostatic chuck 6. The base 2a is made of a conductive metal such as aluminum. A support 4 supports the placement stage 2.

An edge ring 5 made of, for example, silicon, is installed around the wafer W. The edge ring 5 is also called a focus ring. A cylindrical inner wall member 3a made of, for example, quartz, is installed around the edge ring 5, the base 2a, and the support 4. The placement stage 2 is arranged in the bottom portion of the processing chamber 1 via the inner wall member 3a and a support member 3 made of, for example, quartz.

The electrode 6a in the electrostatic chuck 6 is interposed in a dielectric body 6b and connected to a power supply 12. When a voltage is applied from the power supply 12 to the electrode 6a, the wafer W is electrostatically attracted to the electrostatic chuck 6 by Coulomb force.

The placement stage 2 has a flow path 2d therein. A heat medium, such as water, supplied from a chiller unit circulates through an inlet pipe 2b, the flow path 2d, and an outlet pipe 2c. In addition, a heat transfer gas, such as helium gas, is supplied to the rear surface of the wafer W through a gas through holes 30 and gas through holes 30a that penetrate the placement stage 2. With this configuration, the wafer W is controlled to a predetermined temperature.

In the placement stage 2, pin through holes 200 for a plurality of (e.g., three) lifter pins 61 are formed. FIG. 1 illustrates only one lifter pin 61. The lifter pins 61, which are inserted through the pin through holes 200, are connected to a lifting mechanism 62 and are moved up and down by driving the lifting mechanism 62. The structure around the pin through holes 200 and the lifting mechanism 62 for lifting the lifter pins 61 will be described later.

A first RF (radio frequency) power supply 10a is connected to the base 2a via a first matcher 11a, and a second RF power supply 10b is connected to the base 2a via a second matcher 11b. The first RF power supply 10a applies a radio frequency power for plasma generation having a predetermined frequency to the base 2a. The second RF power supply 10b applies a radio frequency power for bias voltage for attracting ions to the base 2a, wherein the radio frequency power for bias voltage has a frequency lower than that of the radio frequency power for plasma generation. However, the radio frequency power supplied from the second RF power supply 10b may be used for plasma generation. A showerhead 16 facing the placement stage 2 is installed above the placement stage 2. The showerhead 16 and the placement stage 2 function as a pair of electrodes (an upper electrode and a lower electrode).

The showerhead 16 has an electrode plate 16b and a ceiling plate 16a. An insulative annular member 95 that supports the showerhead 16 is installed around the showerhead 16, and an upper opening in the processing chamber 1 is closed by the showerhead 16 and the annular member 95. The ceiling plate 16a is made of a conductive material, for example, aluminum having an anodized surface, and the electrode plate 16b is detachably supported under the ceiling plate 16a.

In the ceiling plate 16a, a gas diffusion chamber 16c and a gas inlet port 16g for introducing a processing gas into the gas diffusion chamber 16c are formed. A gas supply pipe 15a is connected to the gas inlet port 16g. A gas supply part 15, a mass flow controller (MFC) 15b, and an opening/closing valve V2 are sequentially connected to the gas supply pipe 15a, and the processing gas is supplied from the gas supply part 15 into the ceiling plate 16a through the gas supply pipe 15a. The opening/closing valve V2 and the mass flow controller (MFC) 15b control the on/off of the gas and a flow rate of the gas.

A plurality of gas flow holes 16d is formed in the lower portion of the gas diffusion chamber 16c toward the interior of the processing chamber 1, and penetrate the electrode plate 16b. The tip ends of the gas flow holes 16d are gas introduction holes 16e. The processing gas is supplied from the gas introduction holes 16e into the processing chamber 1 in the form of a shower via the gas diffusion chamber 16c and the gas flow holes 16d.

A variable DC (direct current) power supply 72 is connected to the showerhead 16 via a low-pass filter (LPF) 71, and the supply of a DC voltage output from the variable DC power supply 72 is turned on/off by a switch 73. The DC voltage from the variable DC power supply 72 and the on/off of the switch 73 are controlled by a controller 90. When the radio frequency power is applied to the placement stage 2 from the first RF power supply 10a and the second RF power supply 10b and the processing gas is turned into plasma, the switch 73 is turned on by the controller 90 as necessary, and a predetermined DC voltage is applied to the showerhead 16.

A cylindrical ground conductor 1a is installed so as to extend from the side wall of the processing chamber 1 to a position above the height position of the showerhead 16. The cylindrical ground conductor 1a has a ceiling wall in the upper portion thereof.

An exhaust port 81 is formed in the bottom portion of the processing chamber 1, and an exhaust apparatus 83 is connected to the exhaust port 81 via an exhaust pipe 82. The exhaust apparatus 83 has a vacuum pump, and operates the vacuum pump so as to reduce the internal pressure of the processing chamber 1 to a predetermined degree of vacuum. A loading/unloading port 84 for a wafer W is installed in the side wall of the processing chamber 1, and the loading/unloading port 84 is configured to be opened/closed by a gate valve 85.

A deposition shield 86 is installed on the inner side of the lateral portion of the processing chamber 1 along the inner wall surface. A deposition shield 87 is detachably provided along the inner wall member 3a. The deposition shields 86 and 87 prevent an etching by-product (deposition) from adhering to the inner wall of the processing chamber 1 and the inner wall member 3a. A conductive member (GND block) 89 connected to be capable of controlling potential with respect to the ground is installed on the deposition shield 86 at a position substantially the same height as the wafer W, thereby preventing abnormal discharge.

The substrate processing apparatus 100 is integrally controlled by the controller 90. The controller 90 is provided with a process controller 91 that controls each part of the substrate processing apparatus 100, a user interface 92, and a storage 93.

The user interface 92 includes, for example, a keyboard configured to allow a process manager to input commands in order to manage the substrate processing apparatus 100 therethrough, and a display configured to visualize and display the operation situation of the substrate processing apparatus 100.

The storage 93 stores, for example, a control program (software) for causing the process controller 91 to execute various kinds of process executed in the substrate processing apparatus 100, and recipes in which, for example, processing condition data are stored. Then, if necessary, by calling an arbitrary recipe from the storage 93 using, for example, an instruction from the user interface 92 and causing the process controller 91 to execute the recipe, desired processing is performed by the substrate processing apparatus 100 under the control of the process controller 91. In addition, the control program and the recipes for, for example, the processing condition data may be used in the state of being stored in a non-transitory computer-readable storage medium, or may be used online by causing the control program and the recipes to be transmitted from another device via, for example, a dedicated line at any time. The storage medium may be, for example, a hard disc, a CD, a flexible disc, or semiconductor memory.

Configuration of Placement Stage

Next, the configuration of the placement stage 2 will be described with reference to FIG. 2. FIG. 2 is an enlarged schematic cross-sectional view of the placement stage 2 in the substrate processing apparatus 100 of FIG. 1. FIG. 2 illustrates the case where a lifter pin 61 is raised to support a wafer W.

The electrostatic chuck 6 has a disk shape, and has a placement surface 21 on which a wafer W is placed, and a rear surface 22 facing the placement surface 21. The placement surface 21 has a circular shape and comes into contact with the rear surface of a wafer W to support the wafer W. The adhesive layer 7 is disposed between the base 2a and the electrostatic chuck 6 so as to bond the base 2a to the rear surface 22 of the electrostatic chuck 6.

The electrostatic chuck 6 has therein a pin through hole 200a, and the base 2a has therein a pin through hole 200b. The inner wall of the pin through hole 200a is formed by the electrostatic chuck 6. The inner wall of the pin through hole 200b is formed by the base 2a.

The pin through hole 200a is an example of a first through hole formed in the electrostatic chuck. The pin through hole 200b is an example of a second through hole formed in the base 2a. The pin through hole 200a and the pin through hole 200b communicate with each other so as to form the pin through hole 200, and the pin through hole 200 accommodates the lifter pin 61 therein.

At least a portion of the lifter pin 61 is made of sapphire. The lifter pin 61 has a cylindrical shape, and has an outer diameter of, for example, about several mm. The upper end 61a of the lifter pin 61 has a spherical surface.

The lifter pin 61 is moved up and down in the pin through hole 200 by the lifting mechanism 62, and operates so as to be capable of protruding/retreating from the placement surface 21 of the placement stage 2. The lifting mechanism 62 adjusts the height of the stop position of the lifter pin 61 such that the upper end 61a of the lifter pin 61 is located just below the rear surface of the wafer W when the lifter pin 61 is accommodated in the pin through hole 200.

As illustrated in FIG. 2, in the state in which the lifter pin 61 is raised, the lifter pin 61 protrudes from the placement surface 21 of the placement stage 2 and supports the wafer W on the placement stage 2. In the state in which the lifter pin 61 supports the wafer W, the lifter pin 61 is lowered by the lifting mechanism 62 to the placement surface 21. In the state in which the lifter pin 61 is lowered, the lifter pin 61 is accommodated in the pin through hole 200, and the wafer W is placed on the placement surface 21. In this manner, the lifter pin 61 conveys the wafer W in the vertical direction. After the wafer W is placed on the placement surface 21, predetermined processing is performed on the wafer W, and then the lifter pin 61 lifts the processed water W and delivers the wafer W to the transport arm.

The pin through hole 200a has a hole diameter matched with the outer diameter of the lifter pin 61, that is, a hole diameter slightly larger than the outer diameter of the lifter pin 61 (e.g., about 0.1 to 0.5 mm), and the lifter pin 61 is moved up and down therein. The hole diameter of the pin through hole 200b is larger than the hole diameter of the pin through hole 200a. In addition, an inner sleeve 201 and an outer sleeve 202 are arranged between the inner wall of the pin through hole 200b and the lifter pin 61, and the inner sleeve 201 and the outer sleeve 202 form a part of the pin through hole 200. The inner sleeve 201 and the outer sleeve 202 are formed as insulaing members of, for example, ceramic. The inner sleeve 201 and the outer sleeve 202 may be made of the same material or different materials, as long as they are insulating members.

The inner sleeve 201 is a cylindrical member having a hole diameter substantially the same as that of the pin through hole 200a. The outer sleeve 202 has a hole diameter matched with the outer diameter of the inner sleeve 201, that is, a hole diameter slightly larger than the outer diameter of the inner sleeve 201, and the inner sleeve 201 is detachably arranged inside the outer sleeve 202.

The outer sleeve 202 is inserted into the pin through hole 200b, and the outer side and the upper portion of the outer sleeve 202 are bonded by an adhesive layer 8 so as to be fixed to the base 2a. The inner sleeve 201 is inserted into the pin through hole 200b to which the outer sleeve 202 is fixed. In the tip end of the inner sleeve 201, a convex portion 209a is formed in the circumferential direction so as to extend on the outer circumference. An O-ring 203 is installed in the tip end surface 201a inside the convex portion 209a of the inner sleeve 201. The tip end surface 201a of the inner sleeve 201 is a flat surface surrounded by the convex portion 209a. The inner sleeve 201 is installed to be detachable together with the O-ring 203 from the pin through hole 200b. The lower ends of the inner sleeve 201 and the outer sleeve 202 protrude at the their lower portions so as to have an L-shaped cross section, and the protrusion portions of the inner sleeve 201 and the outer sleeve 202 are inserted and fitted into a step in the base 2a. As a result, the position of the inner sleeve 201 and the outer sleeve 202 is determined. In this state, the inner sleeve 201 presses the O-ring 203 from below so as to bring the O-ring 203 into contact with the rear surface 22 of the electrostatic chuck 6. With this configuration, the O-ring 203 is installed between the inner sleeve 201 and the electrostatic chuck 6. An O-ring 207 is installed in the recess in the side wall of the inner sleeve 201, which is inserted and fitted into the step in the base 2a. The O-ring 207 mainly functions to prevent the inner sleeve 201 from falling and to disconnect an atmospheric space and a vacuum space.

The adhesive layer 8 is formed from the protrusion portion of the outer sleeve 202 to a side portion of the adhesive layer 7 and the upper end of the outer sleeve 202. The adhesive layers 7 and 8 may be made of different materials.

The O-ring 203 comes into contact with the tip end surface 201a of the inner sleeve 201 and the rear surface 22 of the electrostatic chuck 6, and is pressed against the tip end surface 201a of the inner sleeve 201 so as to expand and contract. Thus, the O-ring 203 seals a plasma space so as to prevent the side of the adhesive layers 7 and 8 from being exposed to the plasma space. As a result, it is also possible to prevent plasma radicals from entering the side nearer to the adhesive layers 7 and 8 than the O-ring 203 of the pin through hole 200. This makes it possible to prevent the adhesive layers 7 and 8 from being consumed.

The O-ring 203 is preferably formed of a material having plasma resistance. For example, the O-ring 203 may be made of a fluorine-based material. The fluorine-based material may be, for example, vinylidene fluoride (FKM) or polytetrafluoroethylene (PTFE). Another example of the fluorine-based material may be tetrafluoroethylene-perfluorovinyl ether (FFKM).

The O-ring 203 is not fixed by the adhesive layer. In addition, the inner sleeve 201 is installed inside the pin through hole 200b to be detachable from the base 2a together with the O-ring 203. Thus, it possible to replace the O-ring 203 by making the inner sleeve 201 detachable together with the O-ring 203. As a result, when the O-ring 203 is deteriorated by, for example, plasma radicals, and thus the sealing effect is reduced, the O-ring 203 can be easily replaced, and thus the maintainability thereof can be improved. In addition, since it is not necessary to replace the placement stage 2 itself in the event of deterioration of the O-ring 203, it is possible to reduce costs.

The O-ring 203 is arranged in the space surrounded by the inner sleeve 201 and the rear surface 22 of the electrostatic chuck 6 to be spaced apart from the outer sleeve 202. As a result, by providing a distance between the O-ring 203 and the surface of the base 2a and installing the insulating member of the outer sleeve 202 therebetween, it is possible to prevent the plasma from entering the pin through hole 200 and to prevent creeping discharge generated between the O-ring 203 and the surface of the base 2a.

The O-ring 203 is a ring-shaped member, and is pressed against the tip end surface 201a of the inner sleeve 201 to expand and contract. The O-ring 203 may have a vertically long shape in which the vertical length of the cross section thereof is longer than the horizontal length. This makes it possible to increase the compressibility rate of the O-ring 203 in the vertical direction, so that the sealing effect of the O-ring 203 can be increased and the adhesive layers 7 and 8 can be reliably prevented from being exposed to plasma and consumed. By making the O-ring 203 have a vertically long shape, it is possible to increase the distance between the O-ring 203 and the outer sleeve 202. This makes it possible to secure a space when the O-ring 203 expands due to, for example, heat input from plasma. Further, it is also possible to widen the space when the O-ring 203 expands due to, for example, heat input from the plasma by cutting the corner of the upper end of the inner sleeve 201 into a round shape.

In the present embodiment, the outer sleeve 202 is fixed, but may be detachably attached to the base 2a. That is, the inner sleeve 201 and the outer sleeve 202 are installed such that at least the inner sleeve 201 is detachable from the base 2a together with the O-ring 203.

The O-ring 203 is an example of a sealing member that is installed between the rear surface of the wafer placement part and the sleeve and that seals the first adhesive layer in the state of being spaced apart from the adhesive layer. The adhesive layer 7 is an example of the first adhesive layer. The inner sleeve 201 is an example of the first sleeve, and the outer sleeve 202 is an example of the second sleeve provided outside the first sleeve. The outer sleeve 202 is fixed to the base 2a inside the pin through hole 200b by the second adhesive layer. The adhesive layer 8 is an example of the second adhesive layer.

The inner sleeve 201 and the outer sleeve 202 are examples of cylindrical sleeves, and may be integrally formed without being divided into two. In this case, the integrally formed sleeve is installed to be detachable from the base 2a together with the O-ring 203.

However, as in the present embodiment, it is preferable to divide the sleeve into the inner sleeve 201 and the outer sleeve 202. Thereby, it is possible to widen the distance between the O-ring 203 and the adhesive layers 7 and 8 by providing an insulating member for the outer sleeve 202 between the O-ring 203 and the adhesive layers 7 and 8. This makes it possible to secure a withstand voltage and to suppress creeping discharge that occurs between the O-ring 203 and the surface of the base 2a. Further, it is preferable to divide the sleeve into the inner sleeve 204 and the outer sleeve 205. The adhesive 8 on the upper surfaces of the outer sleeves 202 and 205 may be formed as thin as possible.

In consideration of radical resistance, the adhesive layer 7 may be formed of, for example, an epoxy resin, and the adhesive layer 8 may be formed of, for example, a silicone resin. However, in the present embodiment, since it is possible to enhance the sealing effect of the O-ring 203, the adhesive layers 7 and 8 may be formed of either a silicone resin or an epoxy resin without considering the radical resistance. The adhesive used for the adhesive layers 7 and 8 may be the same material or different materials.

In addition, the electrostatic chuck 6 has therein a gas through hole 30a, and the base 2a has therein a gas through hole 30b. The inner wall of the gas through hole 30a is formed by the electrostatic chuck 6. The inner wall of the gas through hole 30b is formed by the base 2a. The gas through hole 30a and the gas through hole 30b communicate with each other, and form the gas through hole 30 in the placement stage 2. Through the gas through hole 30, helium gas for heat transfer is supplied from the lower side of the base 2a to the rear surface of a wafer W placed on the placement surface 21 of the electrostatic chuck 6.

The diameter of the gas through hole 30b is larger than the diameter of the gas through hole 30a. An inner sleeve 204 and an outer sleeve 205 are arranged on the inner wall of the gas through hole 30b, and the inner sleeve 204 and the outer sleeve 205 form a part of the gas through hole 30. In the tip end of the inner sleeve 204, a convex portion 210a is formed in the circumferential direction so as to extend on the outer circumference thereof. An O-ring 206 is installed on the tip end surface 204a inside the convex portion 210a of the inner sleeve 204. The tip end surface 204a of the inner sleeve 201 is a flat surface surrounded by the convex portion 210a. The O-ring 206 is installed between the inner sleeve 204 and the electrostatic chuck 6. An O-ring 208 is installed in a recess in the side wall of the inner sleeve 204, which is inserted and fitted into the step in the base 2a. The O-ring 208 mainly functions to disconnect the atmospheric space and the vacuum space. The other configurations of the inner sleeve 204, the outer sleeve 205, and the O-ring 206 are the same as the other configurations of the inner sleeve 201, the outer sleeve 202, and the O-ring 203, respectively, and thus a description thereof will be omitted here.

The outer sleeve 205 is inserted into the gas through hole 30b before the inner sleeve 204 is inserted, and the side portion and the upper portion thereof are bonded by the adhesive layer 8 so as to be fixed to the base 2a. The inner sleeve 204 is detachable from the gas through hole 30b together with the O-ring 206 provided thereon.

The O-ring 206 is a ring-shaped and is pressed against the tip end surface 204a of the inner sleeve 204 to expand and contract. The O-ring 206 may have a vertically long shape in which the vertical length of the cross section thereof is longer than the horizontal length. The O-ring 206 seals the adhesive layers 7 and 8 side from the plasma space by coming into contact with the inner sleeve 204 and the rear surface 22 of the electrostatic chuck 6. This makes it possible to prevent plasma radicals from entering the inside of the gas through hole 30b and degrading the adhesive layers 7 and 8. In addition, by providing an insulating member for the outer sleeve 205 between the O-ring 206 and the adhesive layers 7 and 8, it is possible to widen the distance between the O-ring 206 and the adhesive layers 7 and 8 so as to provide a space. For this reason, with the sealing effect of the O-ring 206, it is possible to secure a withstand voltage and to suppress creeping discharge that occurs between the O-ring 206 and the surface of the base 2a. The O-ring 206 may have the same shape and material as the O-ring 203.

The electrostatic chuck 6 is an example of a wafer placement part having the placement surface 21 on which a wafer W is placed and having first through holes formed therein. The pin through hole 200 and the gas through hole 30 are examples of first through holes formed in the wafer placement part. The wafer placement may include at least one of the pin through hole 200 and the gas through hole 30.

That is, the holes formed by the first through hole and the second through hole in the placement stage 2 are at least any one of the hole through which the lifter pin 61 holding the wafer W passes (the pin through hole 200) and the hole through which the heat transfer gas is supplied (gas through hole 30).

In addition, the case in which a through hole similar to the pin through hole 200 is formed in the placement stage 2 under the edge ring 5 and in which a pin capable of moving up and down in the through hole and a drive mechanism configured to move the pin up and down are included may be considered. In this case, the O-ring, the inner sleeve, and the outer sleeve having the above structure may be assembled and set in the through hole into which the pin is inserted. This also makes it possible to prevent plasma radicals from entering the inside of the through-hole and to prevent the adhesive layer from being deteriorated thanks to the installed O-ring.

As described above, with the placement stage 2 according to the present embodiment, the O-rings 203 and 206 come into contact with the inner sleeves 201 and 204 and the rear surface 22 of the electrostatic chuck 6 so as to seal the side of the adhesive layers 7 and 8 from the plasma space. Thereby, it is possible to prevent the adhesive layers 7 and 8 from being deteriorated by plasma radicals entering the inside of the pin through hole 200 and the gas through hole 30 and to prevent abnormal discharge from occurring due to the entry of plasma.

The electrostatic chuck 6 is an example of the wafer placement part, and the placement stage 2 may not have the electrostatic chuck 6. In this case, the wafer placement part does not have the function of an electrostatic chuck 6 that electrostatically attracts a wafer W.

Modification

A placement stage 2 according to a modification of the embodiment will be described with reference to FIGS. 3A to 3C, and FIGS. 4A and 4B. FIGS. 3A to 3C and FIGS. 4A and 4B are views each illustrating an exemplary placement stage 2 according to a modification of the embodiment. In the following, the configuration of a modification of the inner sleeve 201, the outer sleeve 202, and the O-ring 203 will be described, but a modification of the configuration of the inner sleeve 204, the outer sleeve 205, and the O-ring 206 is also possible.

Figure 3A:
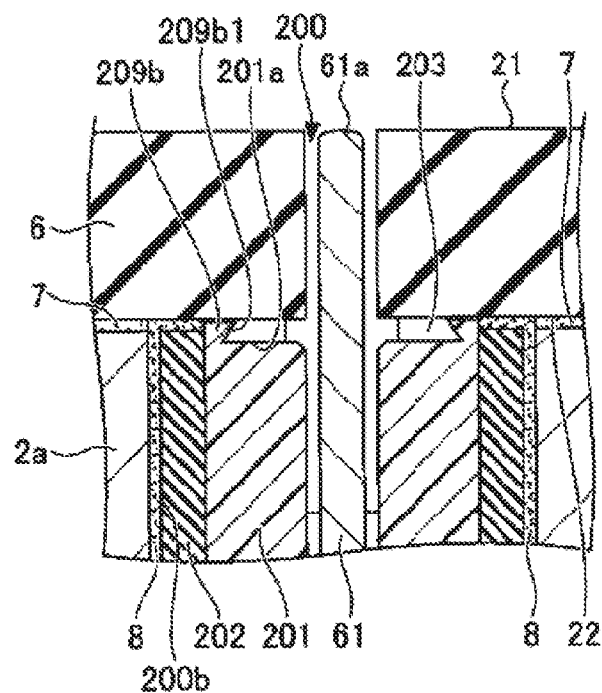
FIGS. 3A to 3C are views illustrating an exemplary placement stage according to a modification of the embodiment.

In Modification 1 illustrated in FIG. 3A, a convex portion 209b is formed in the tip end of the inner sleeve 201 to extend on the outer circumference of the inner sleeve 201 in the circumferential direction. The O-ring 203 is installed on the tip end surface 201a inside the convex portion 209a of the inner sleeve 201. The tip end surface 201a of the inner sleeve 201 is a flat surface surrounded by the convex portion 209b. The inner surface of the convex portion 209b has a groove 209b1 that is inclined such that the upper portion of the convex portion 209 is located more inward than the lower portion of the convex portion 209. As a result, the O-ring 203 is configured such that, when pressed against the tip end of the inner sleeve 201 to expand or contract, the O-ring 203 enters the groove 209b1 and thus the inner sleeve 201 and the O-ring 203 are engaged with each other so as to be prevented from coming off.

Figure 3B:
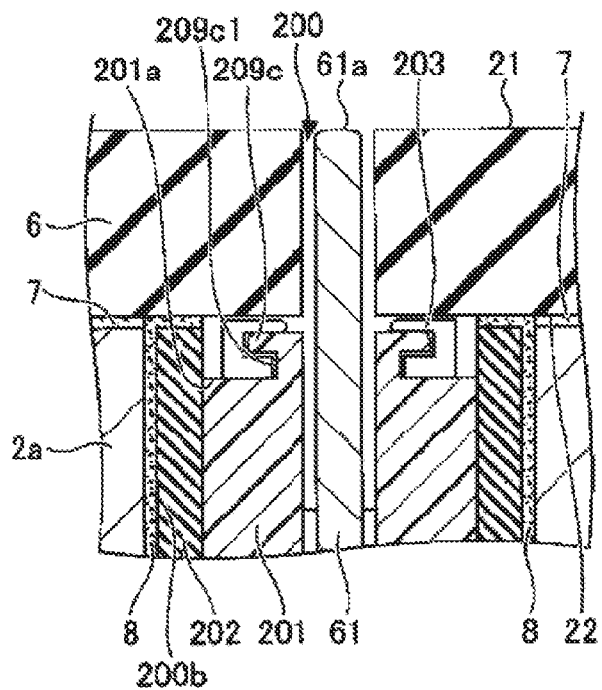

In Modification 2 illustrated in FIG. 3B, a convex portion 209c is formed at the tip end of the inner sleeve 201 so as to extend on the inner circumference of the inner sleeve 201 in the circumferential direction. The upper portion of the convex portion 209c protrudes radially outward in a horizontal direction, whereby the tip end of the inner sleeve 201 has a groove 209c1 and is L-shaped.

The O-ring 203 is installed on the tip end surface 201a outside the convex portion 209c of the inner sleeve 201. The O-ring 203 has a U-shaped cross section that is opposite that of the groove 209c1, and is configured such that, when pressed against the tip end of the inner sleeve 201 to expand or contract, the O-ring 203 enters the inside the groove 209c1 or the space between the rear surface 22 of the electrostatic chuck 6 and the top surface of the convex portion 209c, and the inner sleeve 201 and the O-ring 203 are engaged with each other so as not to come off.

Figure 3C:
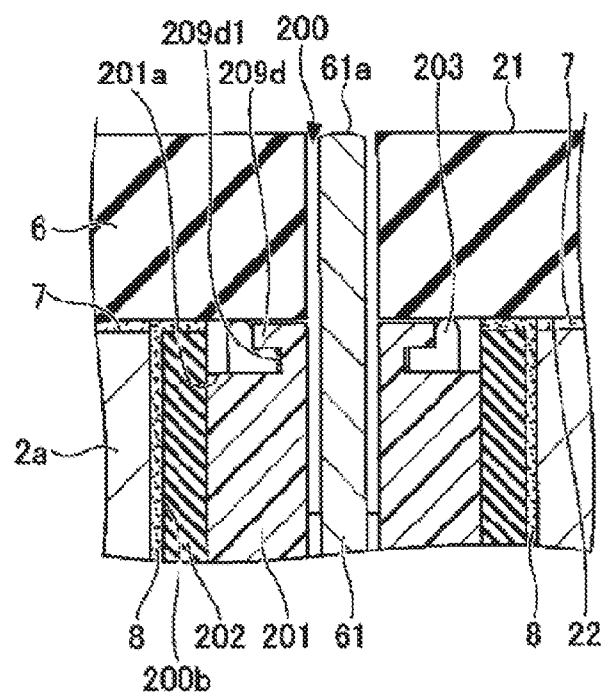

In Modification 3 illustrated in FIG. 3C, a convex portion 209d is formed at the tip end of the inner sleeve 201 so as to extend on e inner circumference of the inner sleeve 201 in the circumferential direction. The upper portion of the convex portion 209d protrudes radially outward in a horizontal direction, whereby the tip end of the inner sleeve 201 has therein a groove 209d1 and is L-shaped.

The O-ring 203 is installed on the tip end surface 201a outside the convex portion 209d of the inner sleeve 201. The O-ring 203 has an L shape such that the lower portion thereof protrudes toward the inner peripheral side and is inserted and fitted into the groove 209d1. When the O-ring 203 is pressed against the tip end of the inner sleeve 201 to expand or contract, the inner sleeve 201 and the O-ring 203 are engaged with each other in the groove 209d1 so as not to come off.

With the placement stage 2 according to each of Modifications 1 to 3 illustrated in FIGS. 34 to 3C described above, the inner sleeve 201 and the O-ring 203 may be integrated.

Figure 4A:
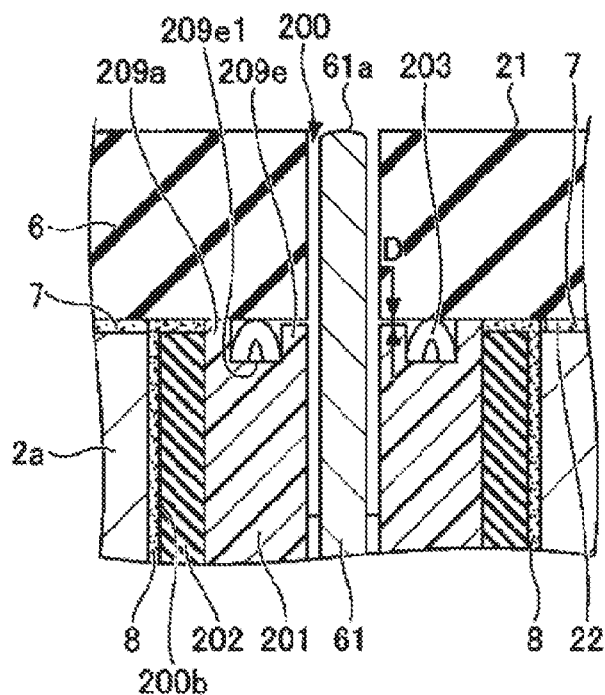
FIGS. 4A and 4B are views illustrating an exemplary placement stage according to a modification of the embodiment.

In Modification 4 illustrated in FIG. 4A, a convex portion 209a is formed at the tip end of the inner sleeve 201 so as to extend on the outer circumference of the inner sleeve 201 in the circumferential direction, and a convex portion 209e is formed to extend on the inner circumference of the inner sleeve 201 in the circumferential direction. A groove 209e1 is formed between the convex portion 209a and the convex portion 209e. The upper portion of the convex portion 209a is in contact with the sear surface 22 of the electrostatic chuck 6 in order to fix the position of the inner sleeve 201.

A slight gap D is formed between the upper portion of the convex portion 209e and the rear surface 22 of the electrostatic chuck 6. The O-ring 203 is formed by dividing the ring-shaped member (hollow torus-shaped member) into halves, and is arranged such that the divided surface is in contact with the bottom surface of the groove 209e1. As a result, the O-ring 203 has a half-ring shape and is arranged in the groove 209e1. When the O-ring 203 is pressed against the tip end of the inner sleeve 201 to expand or contract, the inner sleeve 201 and the O-ring 203 are engaged with each other in the groove 209e1 so as not to come off.

Figure 4B:
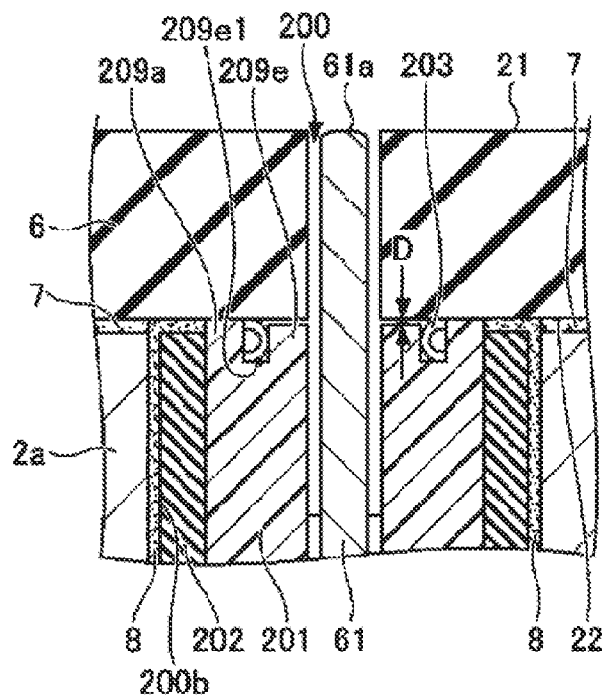

As illustrated in Modification 5 of FIG. 4B, the radial width of the convex portion 209e may be made wider than that of Modification 4 in FIG. 4A, and the radial width of the groove 209e1 may be made narrower than that of Modification 4 in FIG. 4A. The O-ring 203 is arranged in the groove 209e1 in the inner sleeve 201. The O-ring 203 is formed by dividing the ring-shaped member (hollow torus-shaped member) into halves, and is arranged such that the divided surface is in contact with the inner circumferential surface of the convex portion 209a. As a result, the O-ring 203 has a half-ring shape and is fitted into the groove 209e1. When the O-ring 203 is pressed against the tip end of the inner sleeve 201 to expand or contract, the inner sleeve 201 and the O-ring 203 are engaged with each other in the groove 209e1 so as to be prevented from coming off.

With the placement stage 2 according to each of Modifications 4 to 5 illustrated in FIGS. 4A and 4B described above, the inner sleeve 201 and the O-ring 203 may be integrated.

It shall be understood that the stage and the substrate processing apparatus according to the embodiment disclosed herein are illustrative and not restrictive in all aspects. The above embodiments may be modified and improved in various forms without departing from the scope and spirit of the appended claims. The matters described in the above embodiments may take other configurations without contradiction, and may be combined without contradiction.

In this specification, a wafer W has been described as an example of a substrate. However, the substrate is not limited thereto, and may be any of various substrates used for a flat panel display (FPD), a printed circuit board, or the like.

The substrate processing apparatus 100 of the present disclosure is applicable to any of a capacitively coupled plasma (CCP)-type substrate processing apparatus, an inductively coupled plasma (ICP)-type substrate processing apparatus, a radial line slot antenna (RLSA)-type substrate processing apparatus, an electron cyclotron resonance plasma (ECR)-type substrate processing apparatus, and a helicon wave plasma (HWP)-type substrate processing apparatus. The substrate processing apparatus 100 may be an apparatus that uses plasma or an apparatus that does not use plasma.

According to an aspect, it is possible to prevent consumption of an adhesive layer used in a placement stage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A placement stage comprising:
a wafer placement part having a placement surface on which a wafer is placed and a first through hole formed therein;
a base bonded to a rear surface of the wafer placement part by a first adhesive layer, and including a second through hole formed in the base, the second through hole having a hole diameter larger than a hole diameter of the first through hole and communicating with the first through hole;
a cylindrical sleeve installed in the second through hole to be detachable from the base together with an O-ring; and
the O-ring installed between the rear surface of the wafer placement part and the sleeve to be spaced apart from the first adhesive layer so as to seal the first adhesive layer,
wherein a convex portion is formed integrally with the sleeve to extend on an outer circumference of a tip end of the sleeve in a circumferential direction,
wherein an inner surface of the convex portion has a groove that is inclined such that an upper portion of the convex portion is located more inward than a lower portion of the convex portion,
wherein the O-ring is pressed against a tip end surface of the sleeve to expand and contract with one side not covered by the sleeve,
wherein the sleeve includes a first sleeve and a second sleeve installed outside the first sleeve,
wherein lower ends of the first sleeve and the second sleeve protrude at lower portions of the first sleeve and the second sleeve respectively so as to each have an L-shaped cross section.

2. The placement stage of claim 1, wherein the O-ring is not fixed by an adhesive layer.

3. The placement stage of claim 2, wherein at least the first sleeve is provided to be detachable from the base together with the O-ring.

4. The placement stage of claim 3, wherein the O-ring is disposed in a space surrounded by the first sleeve, the second sleeve and the rear surface of the wafer placement part, and is disposed to be spaced apart from the second sleeve.

5. The placement stage of claim 4, wherein the second sleeve is bonded to the base by a second adhesive layer within the second through hole.

6. The placement stage of claim 5, wherein the first adhesive layer, which bonds the rear surface of the wafer placement part and the base, and the second adhesive layer, which bonds the second sleeve and the base, are formed of different materials.

7. The placement stage of claim 6, wherein a hole formed by the first through hole and the second through hole is at least one of a hole through which a lifter pin configured to hold the wafer passes and a hole through which a transfer gas is supplied.

8. The placement stage of claim 1, wherein at least the first sleeve is provided to be detachable from the base together with the O-ring.

9. The placement stage of claim 1, wherein at least the first sleeve is provided to be detachable from the base together with the O-ring,
wherein the second sleeve is bonded to the base by a second adhesive layer within the second through hole, and
wherein the first adhesive layer, which bonds the rear surface of the wafer placement part and the base, and the second adhesive layer, which bonds the second sleeve and the base, are formed of different materials.

10. The placement stage of claim 1, wherein a hole formed by the first through hole and the second through hole is at least one of a hole through which a lifter pin configured to hold the wafer passes and a hole through which a transfer gas is supplied.

11. The placement stage of claim 1, wherein a diameter of the lower end of the first sleeve that protrudes at the lower portion of the first sleeve is identical to a diameter of the lower end of the second sleeve that protrudes at the lower portion of the second device.

12. A substrate processing apparatus comprising:
a processing chamber; and
a placement stage disposed within the processing chamber;
wherein the placement stage includes:
a wafer placement part having a placement surface on which a wafer is placed and a first through hole formed therein;
a base bonded to a rear surface of the wafer placement part by a first adhesive layer and including a second through hole in the base, the second through hole having a hole diameter larger than a hole diameter of the first through hole and communicating with the first through hole;

a cylindrical sleeve installed in the second through hole to be detachable from the base together with an O-ring; and the O-ring installed between the rear surface of the wafer placement part and the sleeve to be spaced apart from the first adhesive layer so as to seal the first adhesive layer, wherein a convex portion is formed integrally with the sleeve to extend on an outer circumference of a tip end of the sleeve in a circumferential direction, wherein an inner surface of the convex portion has a groove that is inclined such that an upper portion of the convex portion is located more inward than a lower portion of the convex portion, wherein the O-ring is pressed against a tip end surface of the sleeve to expand or contract with one side not covered by the sleeve, wherein the sleeve includes a first sleeve and a second sleeve installed outside the first sleeve, wherein lower ends of the first sleeve and the second sleeve protrude at lower portions of the first sleeve and the second sleeve respectively so as to each have an L-shaped cross section.

13. The substrate processing apparatus of claim 12, wherein a diameter of the lower end of the first sleeve that protrudes at the lower portion of the first sleeve is identical to a diameter of the lower end of the second sleeve that protrudes at the lower portion of the second sleeve.

* * * * *

UNITED STATES PATENT AND TRADEMARK OFFICE
CERTIFICATE OF CORRECTION

PATENT NO. : 12,300,530 B2
APPLICATION NO. : 16/943600
DATED : May 13, 2025
INVENTOR(S) : Daisuke Satake It is certified that error appears in the above-identified patent and that said Letters Patent is hereby corrected as shown below:

In the Claims

Claim 11, Column 12, Line 56, please delete the phrase "second device" and replace with "second sleeve".

Signed and Sealed this
Twenty-fourth Day of June, 2025

Coke Morgan Stewart
*Acting Director of the United States Patent and Trademark Office*